United States Patent
Tesch et al.

(10) Patent No.: US 10,192,708 B2
(45) Date of Patent: Jan. 29, 2019

(54) ELECTRON EMITTER SOURCE

(71) Applicant: Oregon Physics, LLC, Hillsboro, OR (US)

(72) Inventors: Paul P. Tesch, Hillsboro, OR (US); Gerald G. Magera, McMinnville, OR (US)

(73) Assignees: OREGON PHYSICS, LLC, Beaverton, OR (US); APPLIED PHYSICS TECHNOLOGIES, INC., McMinnville, OR (US)

( * ) Notice: Subject to any disclaimer, the term of this patent is extended or adjusted under 35 U.S.C. 154(b) by 40 days.

(21) Appl. No.: 15/356,564

(22) Filed: Nov. 19, 2016

(65) Prior Publication Data

US 2017/0148605 A1    May 25, 2017

Related U.S. Application Data

(60) Provisional application No. 62/257,732, filed on Nov. 20, 2015.

(51) Int. Cl.
| | | |
|---|---|---|
| *H01J 19/32* | (2006.01) | |
| *H01J 19/10* | (2006.01) | |
| *H01J 19/38* | (2006.01) | |
| *H01J 19/068* | (2006.01) | |
| *H01J 21/06* | (2006.01) | |
| *H01J 19/82* | (2006.01) | |

(52) U.S. Cl.
CPC ............ *H01J 19/10* (2013.01); *H01J 19/068* (2013.01); *H01J 19/32* (2013.01); *H01J 19/38* (2013.01); *H01J 19/82* (2013.01); *H01J 21/06* (2013.01)

(58) Field of Classification Search
None
See application file for complete search history.

(56) References Cited

U.S. PATENT DOCUMENTS

| 2,897,396 | A | * | 7/1959 | Von Ardenne | ........ H01J 3/021 219/121.15 |
| 4,661,741 | A | * | 4/1987 | Valun | ............. H01J 37/065 313/146 |
| 6,232,040 | B1 | * | 5/2001 | Katsap | ............. H01J 37/065 430/296 |

(Continued)

OTHER PUBLICATIONS

Satoh et al "Development of Iridium Cerium Photo cathode for the generation of high charge electron beam"—Proceedings of IPAC 2014, MOPR1037. p. 679-681.*

*Primary Examiner* — Douglas W Owens
*Assistant Examiner* — Srinivas Sathiraju
(74) *Attorney, Agent, or Firm* — Schaffer IP Law, LLC

(57) ABSTRACT

An electron emitter that consists of: a low work function material including Lanthanum hexaboride or Iridium Cerium that acts as an emitter, a cylinder base made of high work function material that has a cone shape where the low work function material is embedded in the high work function material but is exposed at end of the cone and the combined structure is heated and biased to a negative voltage relative to an anode, an anode electrode that has positive bias relative to the emitter, and a wehnelt electrode with an aperture where the cylindrical base protrudes through the wehnelt aperture so the end of the cone containing the emissive area is placed between the wehnelt and the anode.

20 Claims, 7 Drawing Sheets

(56) References Cited

U.S. PATENT DOCUMENTS

| | | | | |
|---|---|---|---|---|
| 6,400,090 B2* | 6/2002 | Katsap | H01J 37/065 | 250/492.3 |
| 6,452,335 B1* | 9/2002 | Tsuida | H01J 3/021 | 313/491 |
| 6,680,562 B1* | 1/2004 | McGinn | H01J 1/15 | 313/326 |
| 6,798,126 B2* | 9/2004 | Schwind | H01J 1/14 | 313/309 |
| 6,822,241 B2* | 11/2004 | Schut | H01J 3/02 | 250/398 |
| 7,038,389 B2* | 5/2006 | Madocks | H01J 37/3405 | 118/723 MW |
| 7,064,477 B2* | 6/2006 | Magera | H01J 1/15 | 313/271 |
| 7,071,604 B2* | 7/2006 | Dayton, Jr. | H01J 3/023 | 250/399 |
| 7,259,378 B2* | 8/2007 | Madocks | F03H 1/0075 | 250/423 R |
| 7,327,089 B2* | 2/2008 | Madocks | H01J 27/146 | 118/723 DC |
| 7,411,352 B2* | 8/2008 | Madocks | C23C 14/32 | 118/723 E |
| 7,544,523 B2* | 6/2009 | Schwind | H01J 1/304 | 257/E29.096 |
| 7,598,499 B2* | 10/2009 | Platzgummer | B82Y 10/00 | 250/281 |
| 8,026,674 B2* | 9/2011 | Berk | H05G 1/46 | 313/309 |
| 8,581,481 B1* | 11/2013 | Magera | H01J 37/065 | 313/310 |
| 8,617,350 B2* | 12/2013 | Shang | C23C 16/45574 | 118/715 |
| 8,987,982 B2* | 3/2015 | Magera | H01J 37/065 | 313/310 |
| 9,204,527 B2* | 12/2015 | Groves | H05H 3/06 | |
| 9,240,301 B1* | 1/2016 | Mackie | H01J 1/148 | |
| 9,490,098 B1* | 11/2016 | Mackie | H01J 1/148 | |
| 9,655,223 B2* | 5/2017 | Smith | H01J 27/16 | |
| 2002/0079803 A1* | 6/2002 | Magera | H01J 1/15 | 313/341 |
| 2003/0205958 A1* | 11/2003 | Schwind | H01J 1/14 | 313/309 |
| 2009/0154649 A1* | 6/2009 | Behling | H01J 35/10 | 378/137 |
| 2009/0309018 A1* | 12/2009 | Smith | C23C 14/0031 | 250/282 |
| 2010/0126964 A1* | 5/2010 | Smith | H01J 27/16 | 216/68 |
| 2014/0065918 A1* | 3/2014 | Magera | H01J 37/065 | 445/29 |

* cited by examiner

ELECTRON EMITTER SOURCE

CROSS-REFERENCES TO RELATED APPLICATIONS

This application claims the benefit of U.S. Provisional Patent Application No. 62/257,732, filed Nov. 20, 2015, whose contents are incorporated herein for all purposes.

BACKGROUND OF THE INVENTION

Field of the Invention

This invention relates generally to thermal emission sources and more particularly to electron emitters that exhibit high angular intensity and small virtual source size.

Description of the Prior Art

Free electrons that are generated in vacuum are used in many practical devices including Cathode Ray tubes, X-ray machines, electron microscopes, and e-beam lithography tools. Specialized electron emitters that can generate intense directed beams of electrons with specific properties have been developed for these applications. The properties that are important for these emitters are the angular intensity (i.e., the amount of electron current contained in a given emission angle), the emission cone angle size, the emitter virtual source size (i.e., the apparent area where the electron emission appears to be coming from), and the energy spread (i.e., the longitudinal variation in the electron energy).

Two common types of emitters are the thermal emitter and the field emitter, with each type of conventional emitter having their own advantages and disadvantages.

FIG. 1 shows one common method (the "thermal emitter" 10) used to create an electron emitter where a low work function material is heated to high temperature so that the thermal energy of electrons within the solid is high enough for some of the electrons to escape the material. A thermionic emitter is a common electron system implementation and has three main parts: (1) a hot material 20 acting as the emitter that is biased to a negative voltage, (2) an aperture 22 called a wehnelt that is placed in front of emitter and can be biased relative to the emitter, and (3) an anode electrode 24 with an aperture that has a positive voltage relative to the emitter and wehnelt. A beam 26 of electrons pass through the wehnelt and are accelerated through the anode to produce a beam of electrons with energy determined by the difference in voltage between the emitter and the anode. The negative bias on the wehnelt suppresses or turns back electron emission from areas other than within the wehnelt aperture.

As the beam is accelerated through the wehnelt and anode apertures, the beam forms a real cross-over 28. When used with an optical system the electrons appear to be coming from the cross-over location in front of the wehnelt and the apparent size of the emission area is determined by the size of the cross-over and is typically tens of micrometers in size. The amount of electron emission is dependent on the work function of the emissive material and the temperature the emitter is heated to. Lower work function materials produce more current while high temperature produce more current.

Thermal emitters have the advantage of emitting from a larger area, but cannot normally be placed past the wehnelt. When placed behind the wehnelt, much of the current is lost because only a small portion of the emitted particles makes it through the wehnelt aperture and is formed into the main electron beam.

To more tightly control the direction of electron emission at the source, a second common method (FIG. 2; the "field emitter" 30) is used to create an electron emitter where a low work function material is used in a high electric field so that the electrons within a solid can escape the material at a low thermal energy due to emission enhancement from the intense electric field at the surface of the emitter. An electron system implementation of this type of emitter commonly has three main parts: (1) an aperture 40 called a wehnelt or suppressor that can be biased relative to the emitter, (2) a material sharpened to a needle form 42 that protrudes through the wehnelt aperture and is biased to a negative voltage, and (3) an anode electrode 44 with an aperture 46 that has a positive voltage relative to the emitter and wehnelt. In this type of system, the emission is intense at the point of the needle emitter where the electric field is high enough to assist in the emission. This type of emitter is called a cold field emitter if operated near room temperature and a Schottkey emitter if operated at elevated temperatures. One main advantage of field emitters is that they typically have very small virtual source size due to the high field at the emission surface, often less than tens of nanometers in size. However, since the emission area is small these emitters have low current, low angular intensity, and a narrow emission angle Conventional thermal emitters (FIG. 1) are not normally operated in a mode where the emitter extends in front of the wehnelt such as shown in FIG. 2 because all hot surfaces of the emitter that are exposed to the electric field emit electrons, thus resulting in electron emissions in a variety of directions rather than in a confined cone. The large amount of current produced outside the desired cone is problematic and reduces the performance of the emitter, thus having a negative impact on the key properties of the emitter. However, the field emitter of FIG. 2 also has a disadvantage because the emitting surface is only that small rounded tip of the sharpened emitter 42 where the electrons are emitted, thus resulting in a smaller emission. Accordingly, one makes a tradeoff between high emission but low directional control as with thermal emitters, or low emission and high directional control as with field emitters.

Accordingly, the need remains for an improved emitter that overcomes the problems inherent in these prior art designs.

SUMMARY OF THE INVENTION

In one aspect of the invention, an electron emitter that consists of: a low work function material including Lanthanum hexaboride or Iridium Cerium that acts as an emitter, a cylinder base made of high work function material that has a cone shape where the low work function material is embedded in the high work function material but is exposed at end of the cone and the combined structure is heated and biased to a negative voltage relative to an anode, an anode electrode that has positive bias relative to the emitter, and a wehnelt electrode with an aperture where the cylindrical base protrudes through the wehnelt aperture so the end of the cone containing the emissive area is placed between the wehnelt and the anode.

In another aspect of the invention, an electron emitter that consists of: a low work function material such as Lanthanum hexaboride, Cerium hexaboride or Iridium Cerium that acts as an emitter, a cylinder base made of high work function material that has a cone shape where the low work function material is embedded in the high work function material but is exposed at end of the cone and the combined structure is heated and biased to a negative voltage relative to an anode, additionally a gap or chamfer is placed at the interface of the exposed low work function material and the surrounding high work function material, an anode electrode that has positive bias relative to the emitter, and a wehnelt electrode with an aperture where the cylindrical base protrudes through the wehnelt aperture so the end of the cone containing the emissive area is placed between the wehnelt and the anode.

In yet another aspect of the invention, an electron emitter that consists of: a low work function material such as Lanthanum hexaboride, Cerium hexaboride or Iridium Cerium that acts as an emitter, a cylinder with diameter of 300 microns or less made of a solid piece high work function material where the low work function material is embedded in the high work function material but is exposed at end and the combined structure is heated and biased to a negative voltage relative to an anode, an anode electrode that has positive bias relative to the emitter, and a wehnelt electrode with an aperture where the cylindrical base protrudes through the wehnelt aperture so the end of the cone containing the emissive area is placed between the wehnelt and the anode.

The foregoing and other objects, features and advantages of the invention will become more readily apparent from the following detailed description of a preferred embodiment of the invention that proceeds with reference to the accompanying drawings.

DETAILED DESCRIPTION

Figure 1:
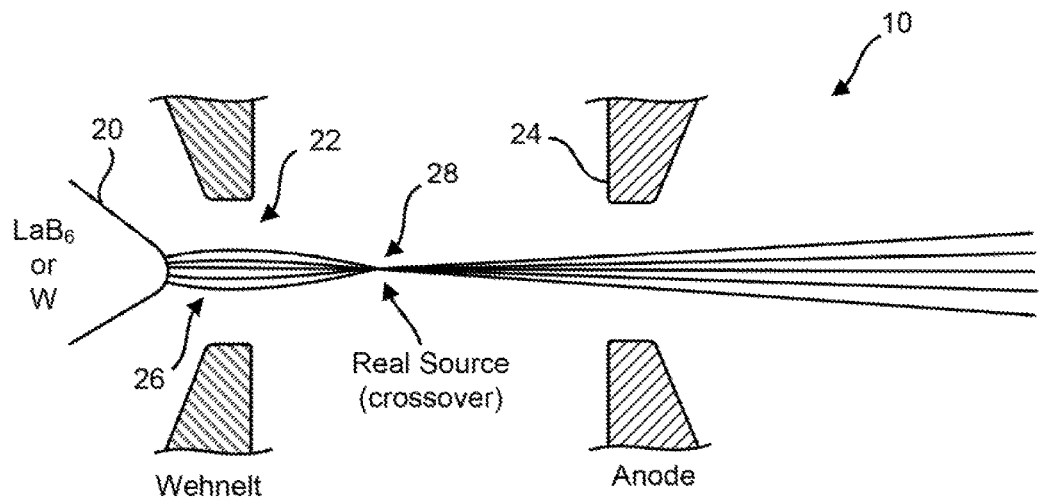
FIG. 1 is a side elevation schematic of a first-type of conventional electron emitter referred to as a thermal emitter.
Figure 2:
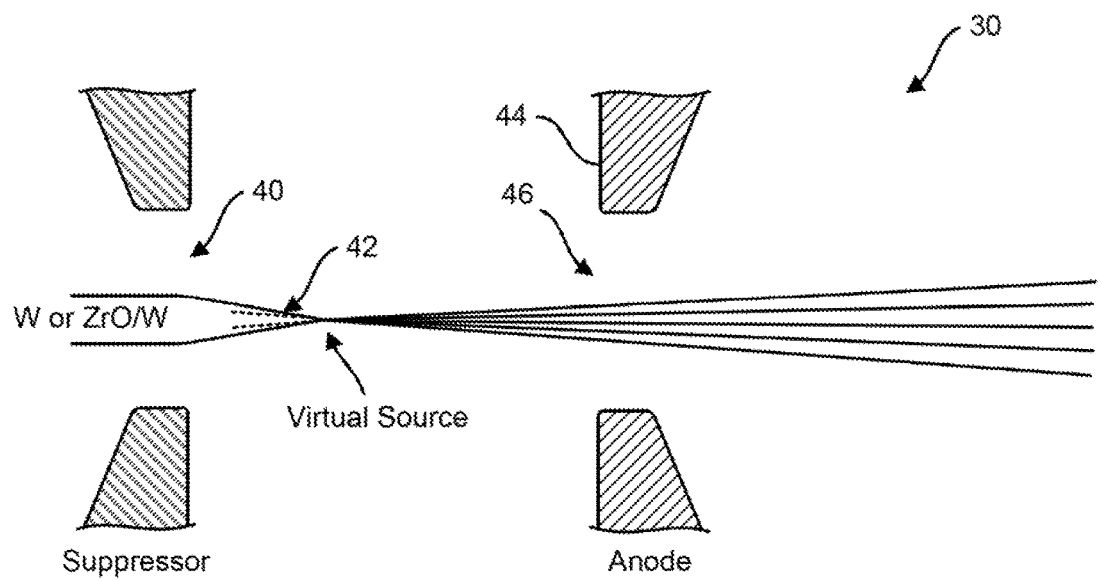
FIG. 2 is a side-elevation schematic of a second type of conventional electron emitter referred to as a field emitter.
Figure 3:
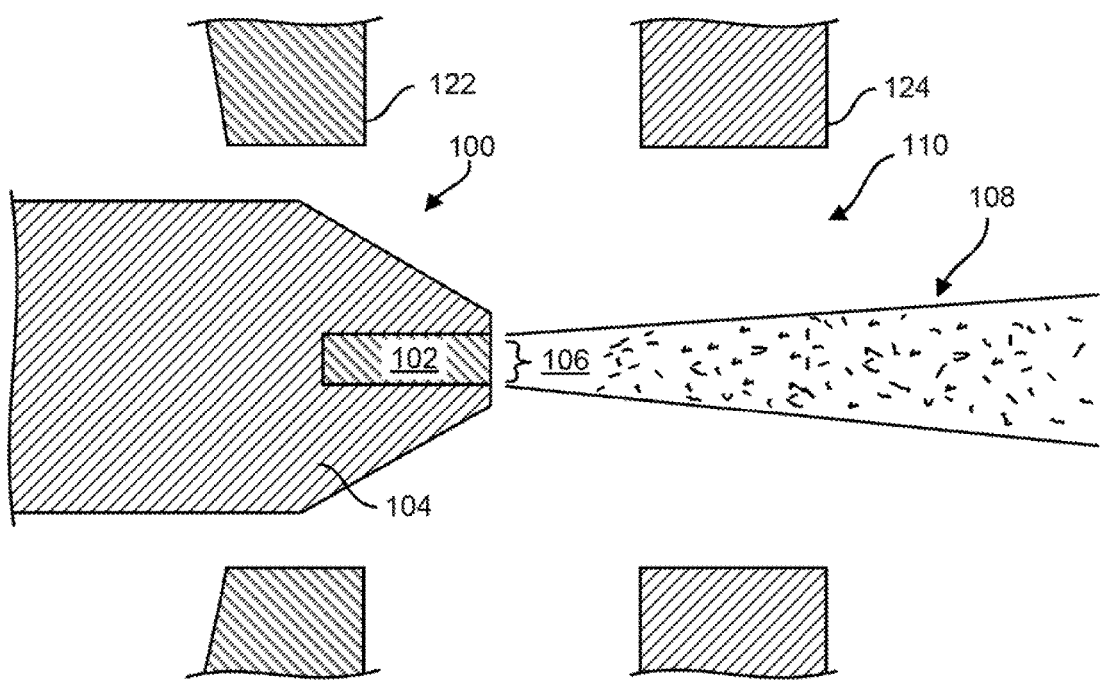
FIG. 3 is a side elevation section view of an emitter assembly constructed according to teachings of the invention.

FIG. 3 shows an improved emitter 100 where a small cylinder of low work function material 102 is embedded in a high work function material 104 with a small area of exposed low work function material that acts as an emitter. The high work function material 104 is not a coating but actually forms the structural member with an embedded emitter 102. The small exposed area 106 can protrude from the wehnelt into a high field area with a cone of emission being generated by the low function material 102 while very little emission is produced by the high work function material 104. Placing the emissive surface 106 in between the wehnelt 122—used for focusing and control of the electron beam—and the anode 124 produces improved properties including small virtual source size, lower energy spread, a well-defined emission angle, and uniform angular intensity. For many applications, the emission properties are superior to that of a standard thermionic emitter 200 that is situated behind the wehnelt.

This type of emitter offers advantages over the field emitter 30 since it does not require a sharpened needle to reach high fields for field assisted emission. The size of emission area can be much larger than that of a typical field emitter and only depends on the size of the exposed low work function material. The size of the emissive area can be selected depending on the targeted current and emission angle and can achieve much higher current and larger beam angles than what can be achieved with the field emitter. This type of emitter offers advantages over the thermal emitter 20 since having the emissive surface 106 immersed in the electric field produces a smaller virtual source size and lower energy spread than can be achieved with a standard thermal emitter.

FIG. 3 shows the key components, whereby the emitter is a low work function material 102 that is embedded in a high work function material 104, the emissive face 106 is located between the wehnelt 122, and the anode 124. The emissive face then emits an electron beam 108 in a cone through the aperture 110 formed in the anode.

Figure 4:
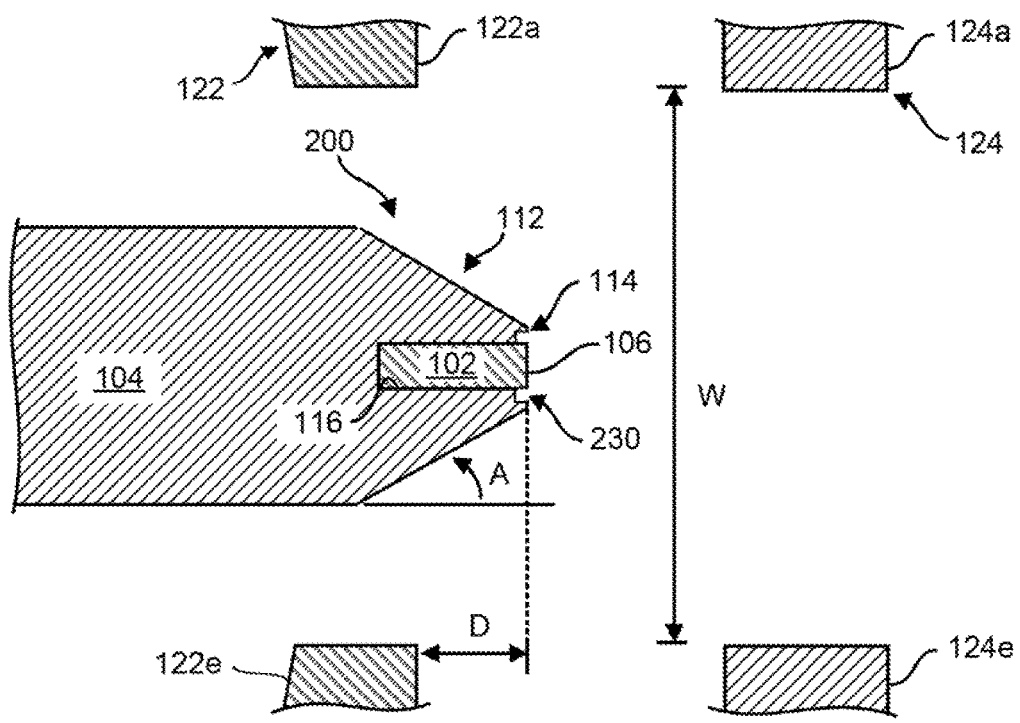
FIG. 4 is a side elevation section view of an emitter assembly constructed with an emitter gap according to a first alternate embodiment of the invention.

FIG. 4 shows an alternate embodiment of the emitter 200 where like features have the same numbering as in the original inventive embodiment 100. The emitter 102 is formed of a 20-100 micron diameter cylinder of low work function material, and having a length greater than 50 microns. Suitable low work function material includes Lanthanum hexaboride or Iridium Cerium. This cylinder 102 is embedded in a high work function material that could be a cylinder 104 with diameter between 100-1000 microns that has a machined cone 112 on the end. One suitable material for the high work function material is high purity graphite. The cone has a 50-400 micron diameter flat 114 at the end that has a hole 116 drilled near the center where the low work function cylinder 102 is inserted. The cone half angle A is preferably between 5 to 85 degrees and more preferably between 20 and 70 degrees. The hole is drilled in the high work function material such that the low work function cylinder has a tight fit within the hole so there is good fit between the two materials and good thermal, mechanical, and electrical contact between the two pieces.

The emissive surface will typically be placed a distance D, between 1 micron and 1 mm, in front of the wehnelt. The wehnelt aperture bore width W will vary with the diameter of the high work function cylinder but is often 50-1000 microns in diameter. The face 106 of the emissive surface is typically flat and can be polished or machined flush with the cone flat (FIGS. 3, 4, 6, and 7) or can be slightly protruding (FIG. 5) from the cone flat 114. In some cases the emissive surface could be slightly concave or convex Typical bias voltages are between 100V and 50000V between the emitter 100 and the anode 124 and about 10-1000V between the wehnelt 122 and the emitter 100.

The emitter 200 in FIG. 4 is distinguished by emitter 100 in FIG. 3 by inclusion of a gap 230 formed between the face 106 of the emissive surface of low work function cylinder 102 and the high work function material about the entrance of hole 116. The gap is preferably between 5-10 microns wide and 10-50 microns deep.

Figure 5:
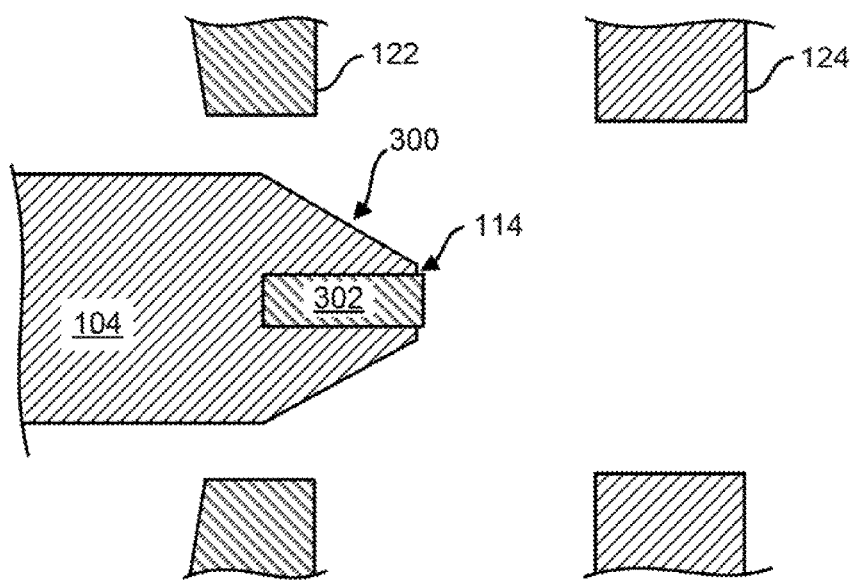
FIG. 5 is a side elevation section view of an emitter assembly constructed with a protruding emitter according to a second alternate embodiment of the invention.
Figure 6:
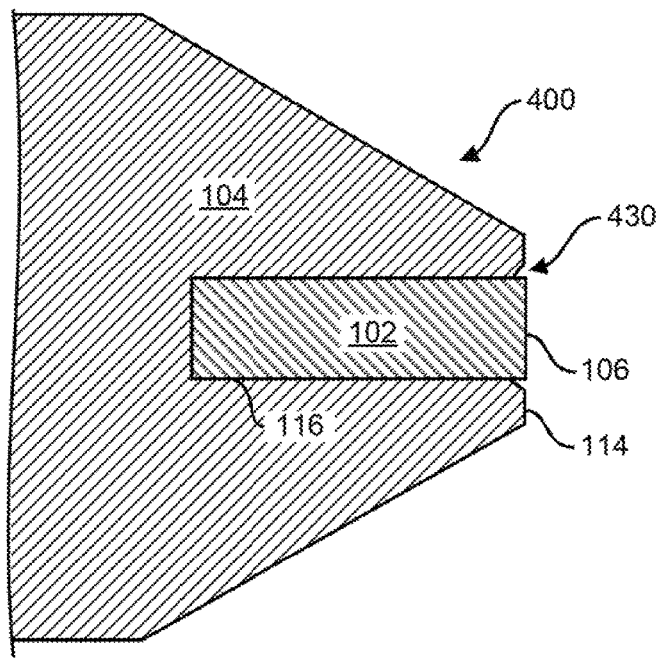
FIG. 6 is a side elevation section view of an emitter assembly with a chamfered gap constructed according to a third alternate embodiment of the invention.

FIG. 5 shows yet another embodiment 300 of the emitter, where the low work function cylinder 302 protrudes past the face 114 of the high work function cylinder in which it is embedded. The optimum protrusion depends on the desired properties and the size of the emissive surface, but is preferably between about 3 to 20 microns for an emissive surface and 70 microns in diameter.

The emitter 400 in FIG. 5 is similar to emitter 200 in FIG. 4 except that it includes chamfered gaps 430 formed between the face 106 of the emissive surface of low work function cylinder 102 and the cone flat 114 of the high work function material about the entrance of hole 116. The gaps 230 in FIG. 4 have a square cross-section. The chamfer angle is preferably in the range of 30-60 degrees.

Figure 7:
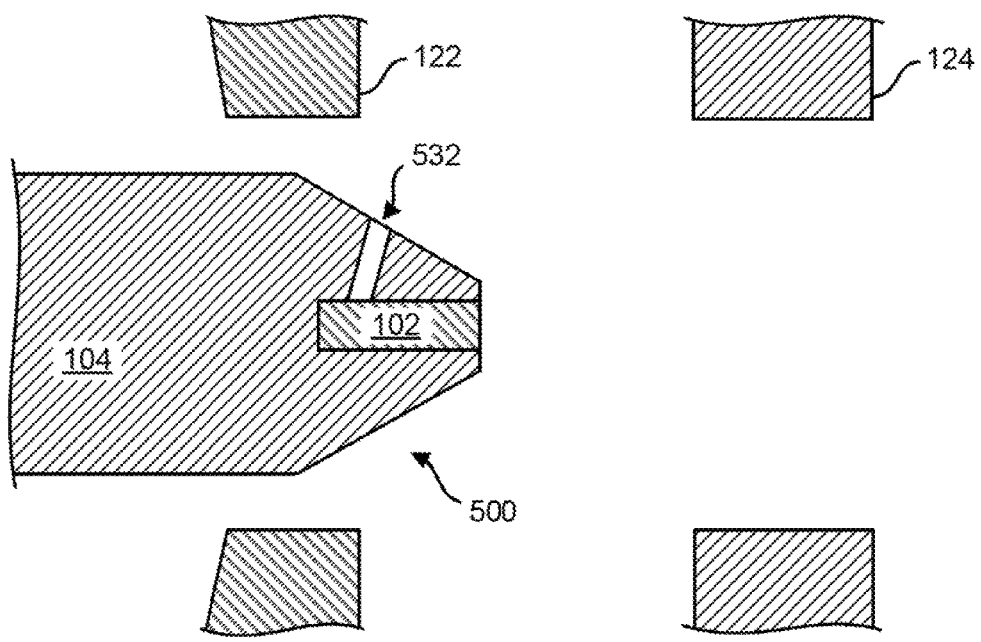
FIG. 7 is a side elevation section view of an emitter assembly with a vent hole constructed according to a fourth alternate embodiment of the invention.

FIG. 7 shows an alternate embodiment 500 of the emitter, which includes drilling one or more vent holes 532 from edge of the embedded emitter 102 to the edge of the graphite cylinder 104. The vent hole improves the vacuum near the emitter by providing an exit path for trapped gases or gas byproducts of reactions that occur at elevated temperatures. A useful vent hole is preferably between about 50-100 microns in diameter.

Figure 8:
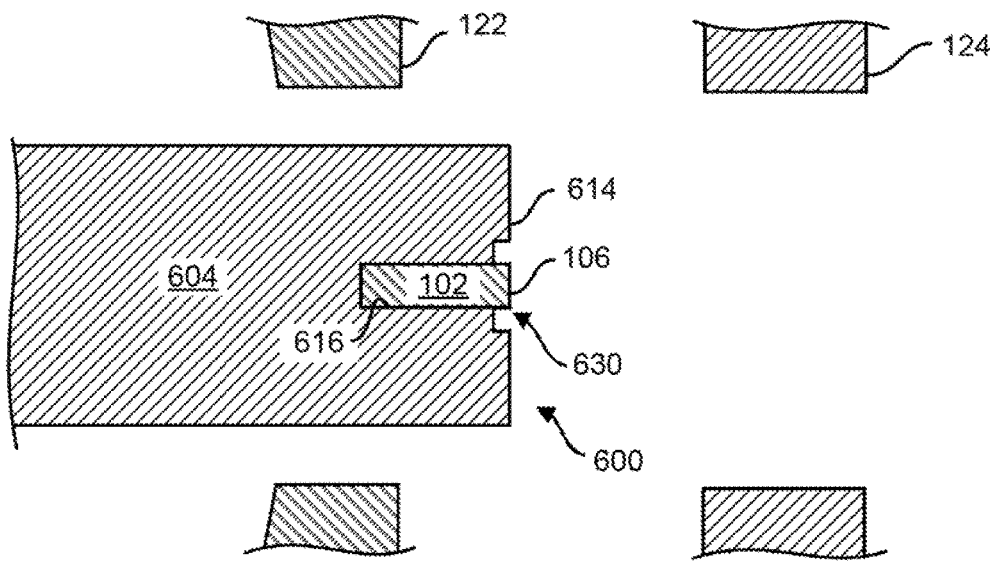
FIG. 8 is a side elevation section view of an emitter assembly with squared profile and emitter gap constructed according to a fifth alternate embodiment of the invention.

FIG. 8 shows yet another alternate embodiment 600 where like features have the same numbering as in the original inventive embodiment 100. The emitter 102 is formed of a 20-100 micron diameter cylinder of low work function material, and having a length greater than 50 microns. This cylinder 102 is embedded in a high work function material that could be a cylinder 604 with diameter between 100-1000 microns terminating in a cylinder end 614 on the end. One suitable material for the high work function material is high purity graphite. As with the embodiment 300 in FIG. 4, emitter 600 includes a gap 630 between the face 106 of the emissive surface of low work function cylinder 102 and the high work function material about the entrance of hole 616.

Figure 9:
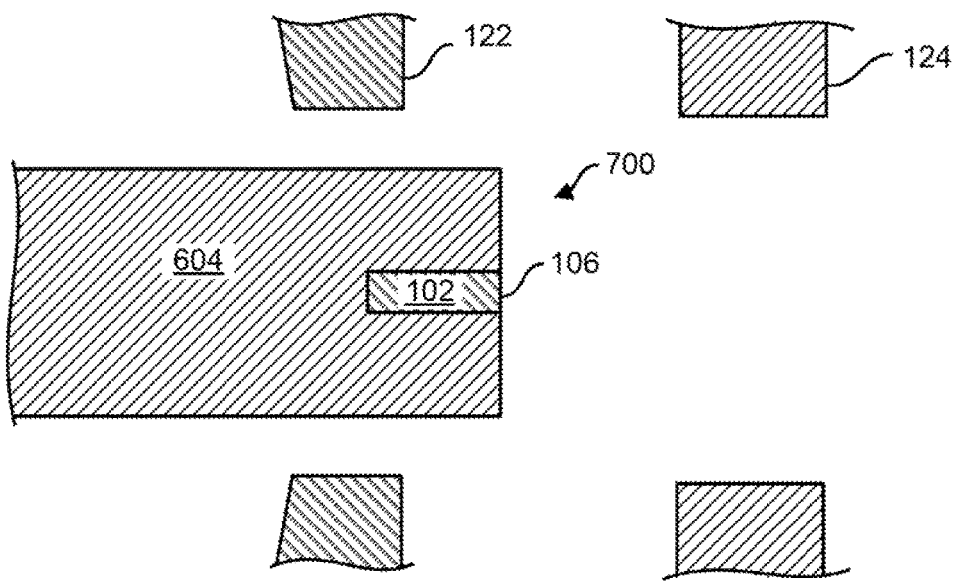
FIG. 9 is a side elevation section view of an emitter assembly with squared profile constructed according to a sixth alternate embodiment of the invention.

FIG. 9 shows an emitter 700 that is similar to that shown and described above in FIG. 8, except without the gap 630. Like features have like numbering.

Unique features of embodiments of the invention include, among other features, the use of a coned graphite cylinder that extends in front of the wehnelt. Furthermore, use of graphite allows the material to be more easily machinable so as to enable drilled holes for the embedded low work function cylinder 102. These features enable the emitter to be positioned in front of the wehnelt. Furthermore, there may also be some benefit to drilling one or more vent hole from edge of the embedded emitter to the edge of the graphite cylinder.

Accordingly, features of the invention include 1) protruding cone shaped embedded emitters using new emitter materials such as IRce, $LaB_6$, etc.; 2) Protruding coned emitters with improved geometries including gaps, chamfers, emissive surface protrusions above 5 microns, vent holes etc. that use any low work function material including $CEB_6$, $LaB_6$, IrCe.; and 3) Protruding cylindrical emitters of less than 300 microns in any geometry including flat face, gapped, chamfered, emissive surface protrusions, vent holes etc. that use any low work function material including $CEB_6$, $LaB_6$, IrCe.

Figure 10:
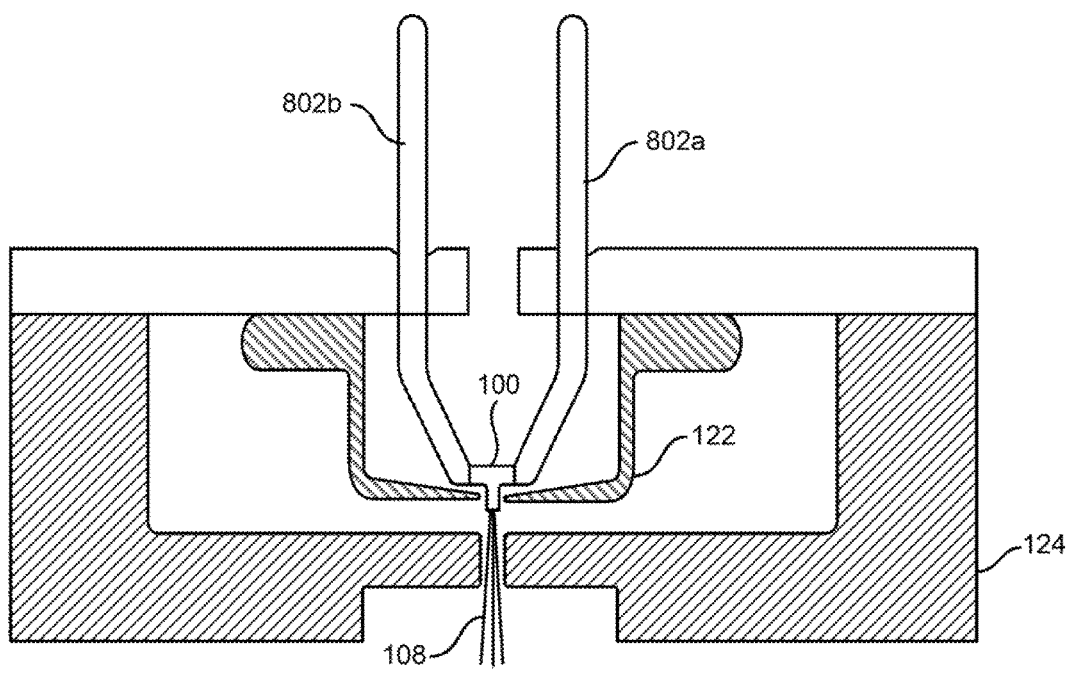
FIG. 10 is a magnified view of FIG. 3 showing the emitter assembly and support equipment, constructed according to a preferred embodiment of the invention, in side elevation.

FIG. 10 illustrates a fuller image of the emitter assembly and support hardware. Included are a typical support and heater circuit that is used to heat the emitter 100 including an electrically resistive material and the metal posts 802*a*, 802*b* where electrical connections are made. The emitter is heated by applying a voltage between the two metal posts 802*a*, 802*b*.

Variations of the invention are further described.

In a first variation, the electron emitter that consists of: a low work function material including Lanthanum hexaboride or Iridium Cerium that acts as an emitter, a cylinder base made of high work function material that has a cone shape where the low work function material is embedded in the high work function material but is exposed at end of the cone and the combined structure is heated and biased to a negative voltage relative to an anode, an anode electrode that has positive bias relative to the emitter, and a wehnelt electrode with an aperture where the cylindrical base protrudes through the wehnelt aperture so the end of the cone containing the emissive area is placed between the wehnelt and the anode.

In a second variation, the electron emitter that consists of: a low work function material such as Lanthanum hexaboride, Cerium hexaboride or Iridium Cerium that acts as an emitter, a cylinder base made of high work function material that has a cone shape where the low work function material is embedded in the high work function material but is exposed at end of the cone and the combined structure is heated and biased to a negative voltage relative to an anode, additionally a gap or chamfer is placed at the interface of the exposed low work function material and the surrounding high work function material, an anode electrode that has positive bias relative to the emitter, and a wehnelt electrode with an aperture where the cylindrical base protrudes through the wehnelt aperture so the end of the cone containing the emissive area is placed between the wehnelt and the anode.

In a third variation, the electron emitter that consists of: a low work function material such as Lanthanum hexaboride, Cerium hexaboride or Iridium Cerium that acts as an emitter, a cylinder with diameter of 300 microns or less made of a solid piece high work function material where the low work function material is embedded in the high work function material but is exposed at end and the combined structure is heated and biased to a negative voltage relative to an anode, an anode electrode that has positive bias relative to the emitter, and a wehnelt electrode with an aperture where the cylindrical base protrudes through the wehnelt aperture so the end of the cone containing the emissive area is placed between the wehnelt and the anode.

Figure 11:
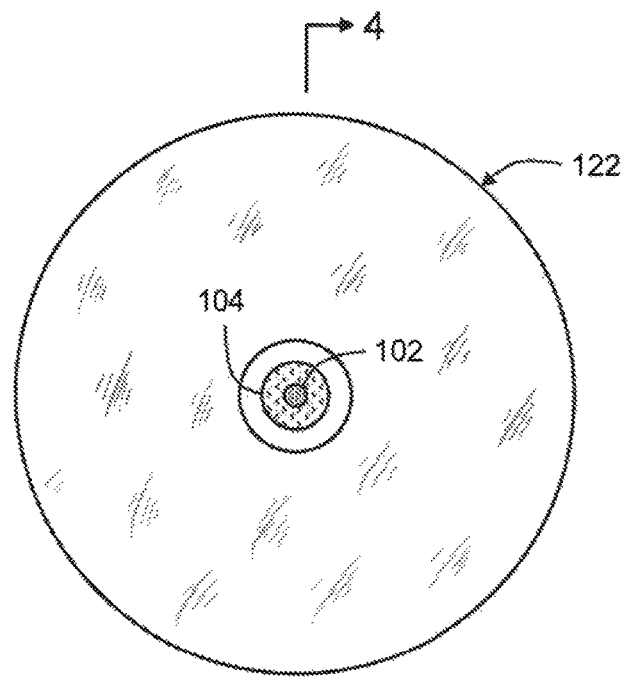
FIG. 11 is an axial elevation of the emitter assembly of FIG. 3 showing a cylindrical wehnelt according to an embodiment of the invention.

FIG. 11 illustrates an axial view of the electron gun assembly of FIG. 3 where the wehnelt 122 and/or anode electrodes 124 are configured with a unitary cylindrical geometry. The wehnelt electrode 122 would be maintained at a common bias voltage—e.g. 1000V—while the anode electrode would be maintained at or near ground potential.

Figure 12:
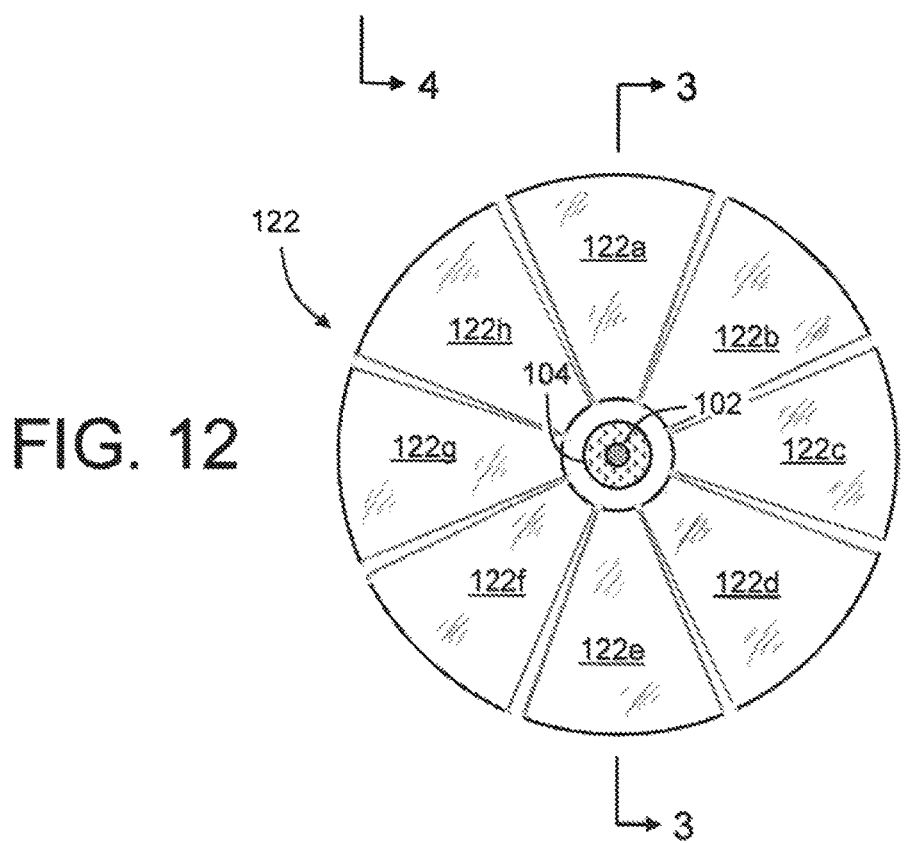
FIG. 12 is an axial elevation of an emitter assembly of FIG. 3 but with an alternate, multi-segmented wehnelt assembly according to an alternate embodiment of the invention.

FIG. 12 illustrates an axial view of the electron gun assembly of FIG. 3 but where the wehnelt 122 and/or anode electrodes 124 are configured in a multi-segmented shape. While FIG. 12 shows a total of eight (8) pie-shaped pieces in spaced orientation and configured about the aperture bore width W, it is understood that any number of segments can be included to effect the directional control and focus of the electron beam emitted from emitter 102. In various embodiments, for instance, the electrode is broken into 2, 4, 8, or 16 segments.

Each electrode segments can have a different voltage applied. The additional segments allow you to slightly control the electric field strength on different portions of the emitter or it could allow you to focus or deflect the beam in different directions. For instance, two segments would allow an operator to deflect the beam in one direction. Four segment would allow an operator to deflect the beam in two directions or focus the beam slightly different in two directions. As one example, an operator could focus a beam that is slightly oval due to defects in the components of the system in order to make a round beam or, in contrast one could convert a beam having a round cross-section into one have an oval cross-section. An 8-segment electrode—characterized by wehnelt segments 122a through 122h, and eight anode segments axially aligned with respective wehnelt segments—would allow you to deflect the beam in two direction and focus it differently in two directions.

In the case of the segmented electrode, and referring to the previously discussed FIG. 3, the top and bottom portion of the anode 124a and 124e or wehnelt electrode 122a and 122e could have a different voltage. Preferably, the segments have a bias voltage that is common to all of them and then small voltage differences between them to create focusing or steering fields. For instance, the wehnelt electrodes (e.g. segments 122b-122d and 122f-122h) could have 1000V on them and then two opposing segments (e.g. segments 122a and 122e) would have +2V and −2V, respectively, on top of this main voltage so one electrode 122a would be 998V and the other 122e would be 1002V. The anode 124 is preferably maintained close to ground but one segment 124a could have 2 volts and the opposite segment 124e may have −2 Volts. In this way, it is preferable to have symmetric voltages on opposing segments about the main applied voltage. On two opposite segments, applying a positive voltage relative to the main voltage on one electrode and a negative voltage relative to the main voltage to the other will cause a deflection whereas applying a positive voltage relative to the main voltage to both electrodes will cause a small amount of focusing.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. An electron emitter comprising:
   a wehnelt
   an anode spaced downstream from said wehnelt;
   a co-axial aperture formed through said wehnelt and said anode; and
   an emitter extending into said co-axial aperture so that a terminal surface of said emitter is positioned between said wehnelt and said anode, said emitter having a cylindrical base formed of a high work function material having a hole formed through said terminal surface and extending into a body of the cylindrical base, said emitter further including a structure formed of a low work function material embedded within said hole and having an exposed emissive area,
   wherein said emitter is heated and biased to a negative voltage relative to the anode.

2. The electron emitter of claim 1, wherein the exposed emissive area extends out from the hole formed through the terminal surface so that the exposed emissive area is downstream of the terminal surface of the high work function cylindrical base.

3. The electron emitter of claim 1, further including a gap interposed between the terminal surface of the emitter and the exposed emissive area of the low work function structure.

4. The electron emitter of claim 1, wherein the cylindrical base of high work function material narrows to a truncated cone ending in a flat circular surface at the terminal surface.

5. The electron emitter of claim 4, wherein the exposed emissive area extends out from the hole formed through the terminal surface so that the emissive surface is downstream of the terminal surface of the high work function cylindrical base.

6. The electron emitter of claim 4, further including a gap interposed between the terminal surface of the emitter and the exposed emissive area of the low work function structure.

7. The emitting structure of claim 6, wherein the gap has a square profile.

8. The emitting structure of claim 6, wherein the gap has a chamfered profile.

9. The electron emitter of claim 1, wherein the low work function material is taken from the group consisting of Lanthanum hexaboride, Cerium hexaboride, and Iridium Cerium.

10. The electron emitter of claim 1, wherein the wehnelt further includes a plurality of segments spaced radially about the co-axial aperture.

11. The electron emitter of claim 10, wherein at least two of the plurality of segments are biased to a different voltage than remaining segments of the wehnelt.

12. The electron emitter of claim 10, wherein wehnelt segments disposed on opposite sides of the co-axial aperture are biased with opposite supplemental voltages to one another to cause a deflection of the electron beam emitted from the electron emitter.

13. The electron emitter of claim 10, wherein wehnelt segments disposed on opposite sides of the co-axial aperture are biased with a same supplemental voltage to cause a focusing of the electron beam emitted from the electron emitter.

14. The electron emitter of claim 10, wherein the plurality of segments is a number taken from the group consisting of 2, 4, 8, and 16 segments.

15. The electron emitter of claim 1, further including a vent hole formed in the cylindrical base and passing from an outer side surface of the cylindrical base to an outer side surface of the structure formed of low work function material and embedded within the hole formed through said terminal surface of said cylindrical base.

16. The electron emitter of claim 1, wherein the cylindrical base is made of high work function material comprised of graphite terminating in a truncated cone shape.

17. An emitter structure comprising:
   a structural cylindrical body formed of a high work function material;
   the structural cylindrical body forming a truncated cone at one end having frustoconical surfaces terminating in a flat circular surface;
   a cylindrical aperture formed through the flat circular surface and into an interior of the structural cylindrical body; and an inner cylindrical body formed of a low work function material received within the cylindrical aperture and terminating in an emitting end adjacent the flat circular surface.

18. The emitter structure of claim 17, wherein the emitting end projects past the flat circular surface.

19. The emitter structure of claim 17, further including a gap formed in the cone end adjacent the emitting end.

20. The emitting structure of claim 17, further including a vent hole formed in the outer cylindrical body and passing from an outer side surface of the structural cylindrical body to an outer side surface of the inner cylindrical body.

* * * * *